United States Patent [19]
Bethurum

[11] Patent Number: 5,563,771
[45] Date of Patent: Oct. 8, 1996

[54] IC CARD WITH BOARD POSITIONING MEANS

[75] Inventor: Gary C. Bethurum, Laguna Niguel, Calif.

[73] Assignee: ITT Corporation, New York, N.Y.

[21] Appl. No.: 589,679

[22] Filed: Jan. 22, 1996

Related U.S. Application Data

[63] Continuation of Ser. No. 528,341, Sep. 14, 1995, which is a continuation-in-part of Ser. No. 201,983, Feb. 25, 1994, Pat. No. 5,477,426, which is a continuation-in-part of Ser. No. 168,101, Dec. 15, 1993.

[51] Int. Cl.$^6$ ..................................................... H05K 1/14
[52] U.S. Cl. ........................... 361/737; 361/752; 257/679
[58] Field of Search .................................... 361/737, 752, 361/796, 728, 729, 730; 257/679; 235/441, 486, 487, 492; 439/44, 74

[56] References Cited

U.S. PATENT DOCUMENTS

| | | | |
|---|---|---|---|
| 4,386,388 | 5/1983 | Beun | 361/399 |
| 4,678,699 | 7/1987 | Kritchevsky | 428/175 |
| 4,681,712 | 7/1987 | Sakakibara | 264/24 |
| 4,689,723 | 8/1987 | Myers | 361/424 |
| 4,889,498 | 12/1989 | Mizuta | 439/86 |
| 4,929,195 | 5/1990 | Seidoh | 439/610 |
| 4,980,223 | 12/1990 | Nakano | 428/198 |
| 5,124,888 | 6/1992 | Suzuki | 361/395 |
| 5,144,533 | 9/1992 | Annett | 361/395 |
| 5,150,282 | 9/1992 | Tomura | 361/424 |
| 5,153,818 | 10/1992 | Mukougawa | 361/395 |
| 5,170,009 | 12/1992 | Kadokura | 174/35 |
| 5,199,903 | 4/1993 | Asick | 439/610 |
| 5,207,586 | 5/1993 | MacGregor | 439/76 |
| 5,242,310 | 9/1993 | Leung | 439/76 |
| 5,330,360 | 7/1994 | Marsh | 439/76 |
| 5,386,340 | 1/1995 | Kurz . | |
| 5,414,253 | 5/1995 | Baudouin . | |
| 5,481,434 | 1/1996 | Banakis et al. | 361/756 |

FOREIGN PATENT DOCUMENTS

| | | |
|---|---|---|
| 0532160 | 7/1992 | European Pat. Off. . |
| 1270399 | 10/1989 | Japan . |
| 5013976 | 1/1993 | Japan . |
| 2139017 | 10/1984 | United Kingdom . |

*Primary Examiner*—Leo P. Picard
*Assistant Examiner*—Y. Whang
*Attorney, Agent, or Firm*—Thomas L. Peterson

[57] ABSTRACT

An IC card is provided which can be constructed at low cost and which allows adjustment of circuit board position. The circuit board (30, FIG. 2) has forward and rearward end portions (34, 36) which are mounted directly on forward and rearward connectors (12, 14), without a separate frame to mechanically hold them together. A cover (60) with upper and lower parts (66, 68), is mechanically mounted to the connectors and is coupled to the circuit board only in an electrical ground. Each-connector is mounted to a circuit board end by pegs (90, 92) that lie on laterally opposite sides of the row of connector contacts (46), with each peg being received in a hole (100, 102) of the circuit board. The pegs can be separate parts (270, FIG. 12) that project through holes (254) in the board and into holes (250) in the connector, and washers (262) can lie between the board and each connector at locations adjacent to the pegs.

5 Claims, 5 Drawing Sheets

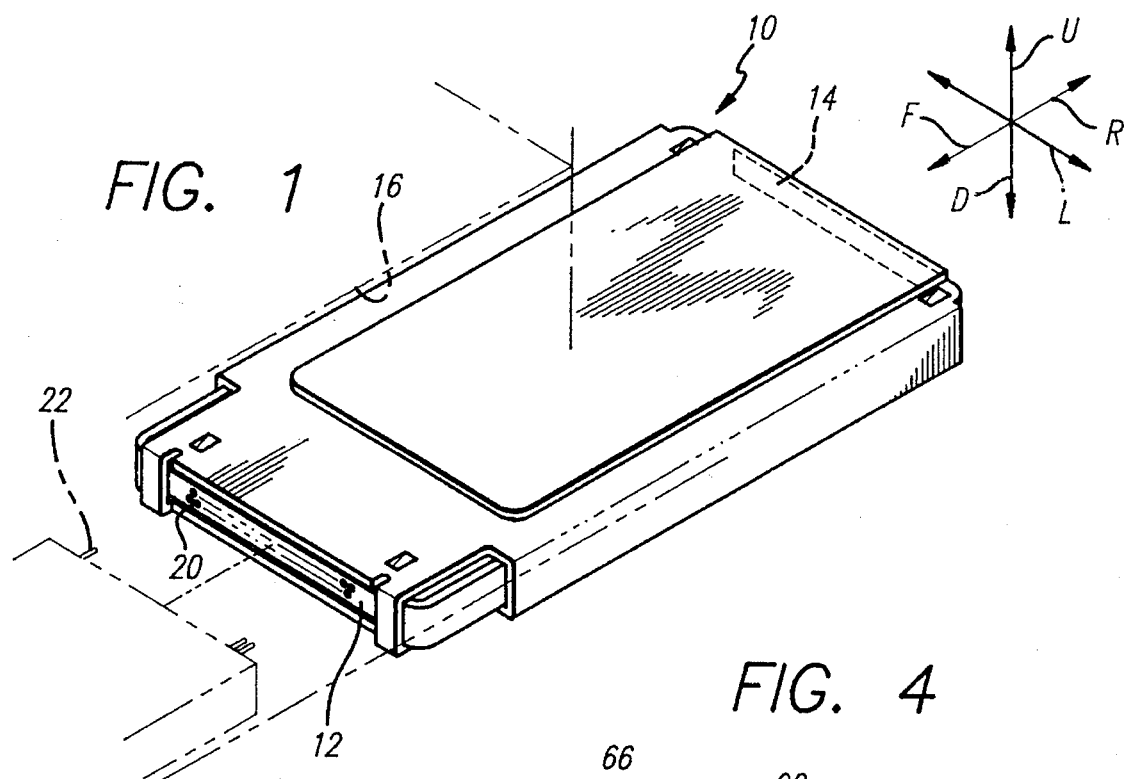
FIG. 1
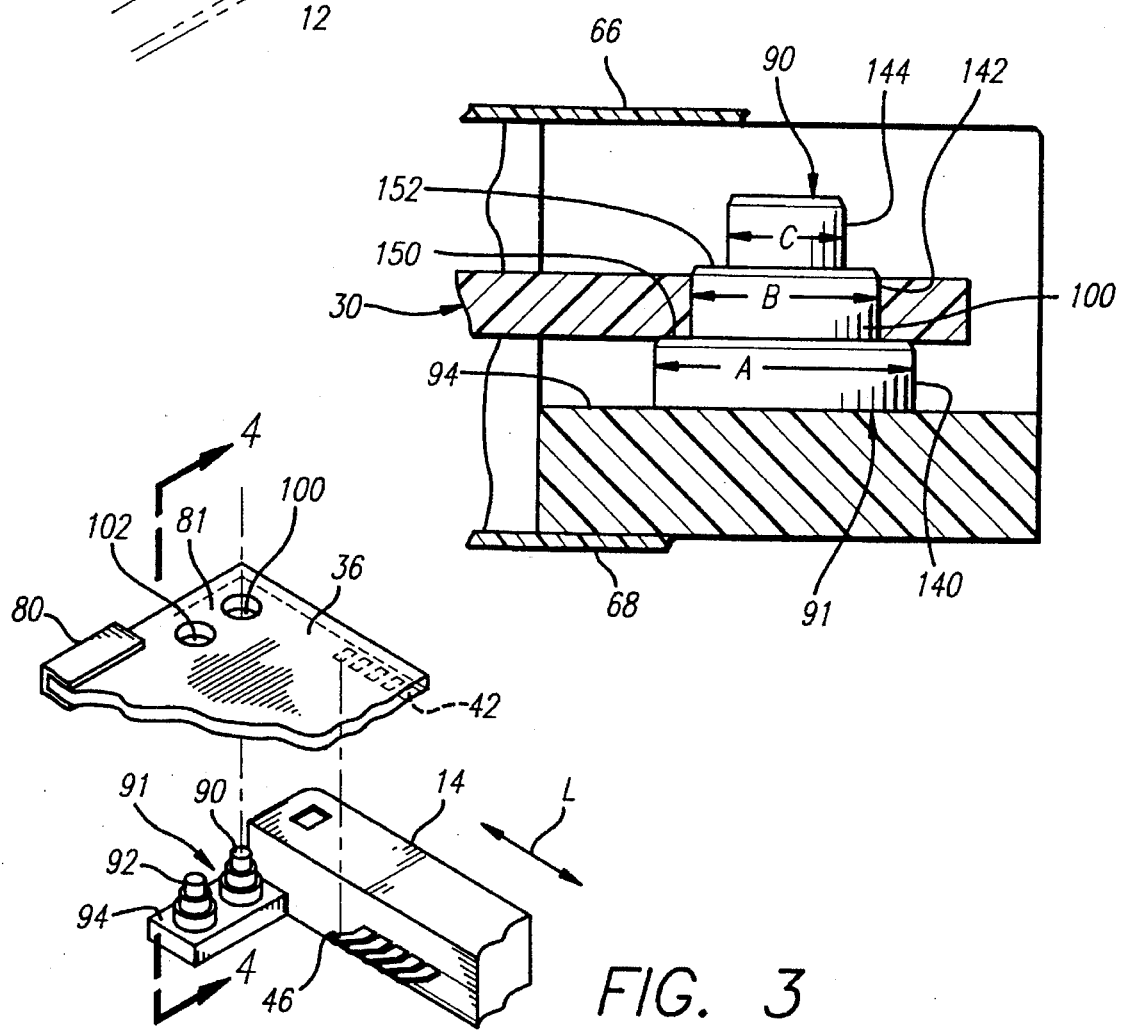
FIG. 4
FIG. 3

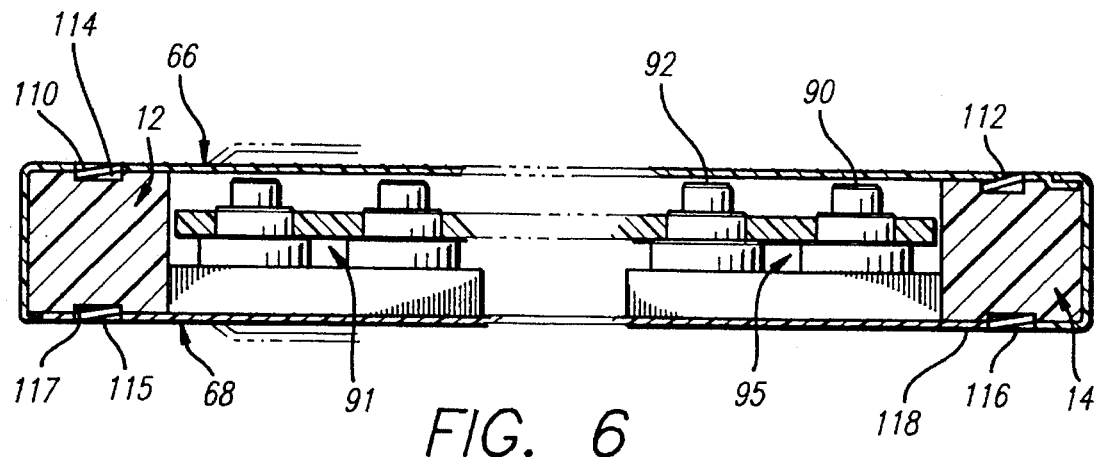
FIG. 6
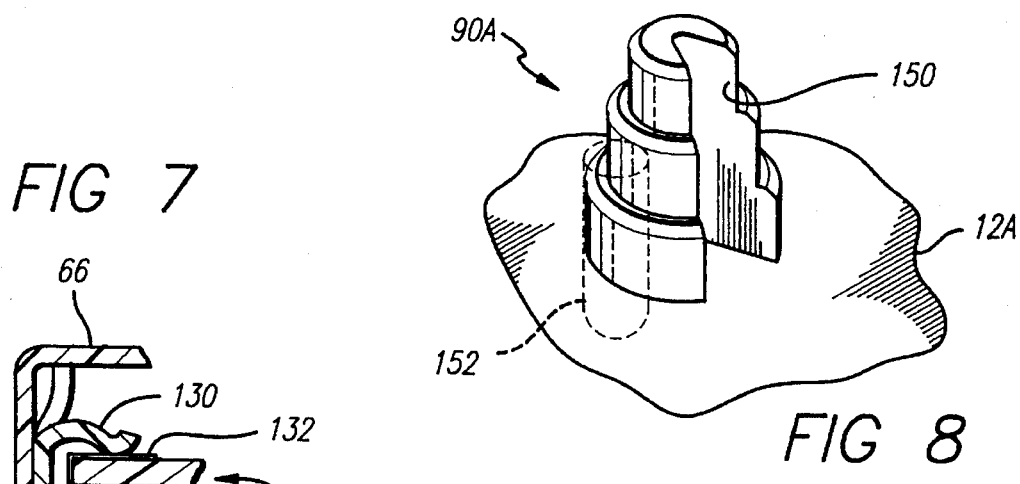
FIG 7
FIG 8
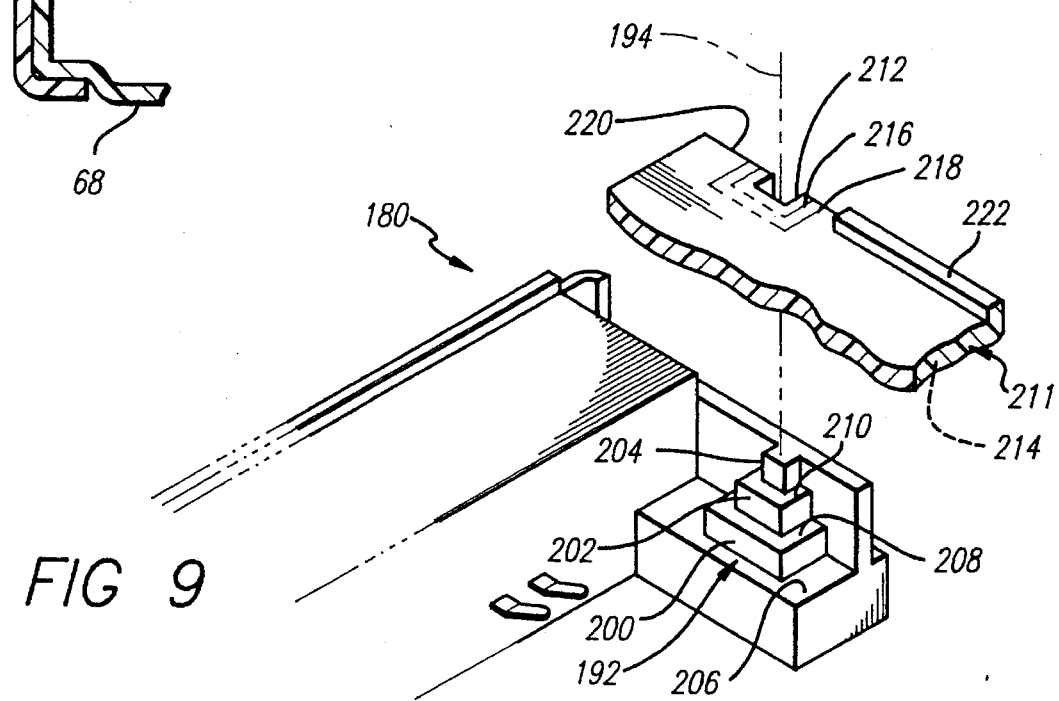
FIG 9

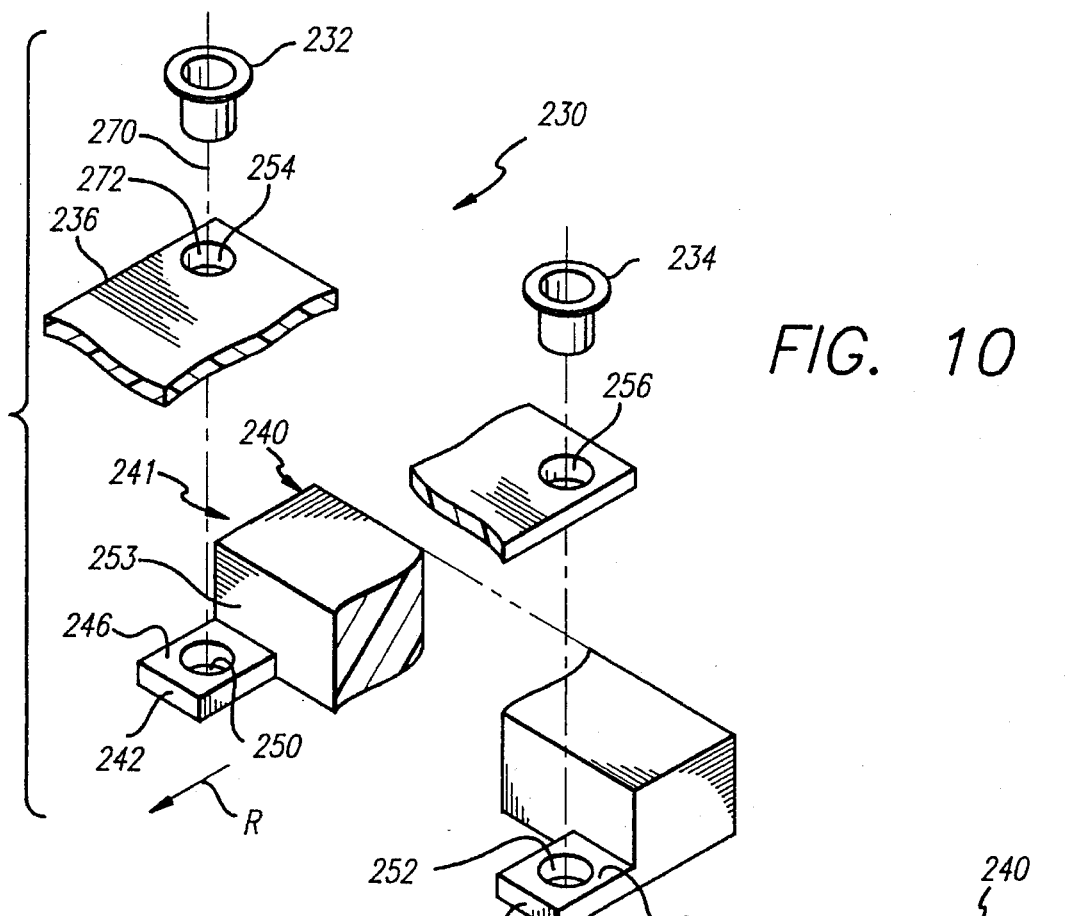
FIG. 10
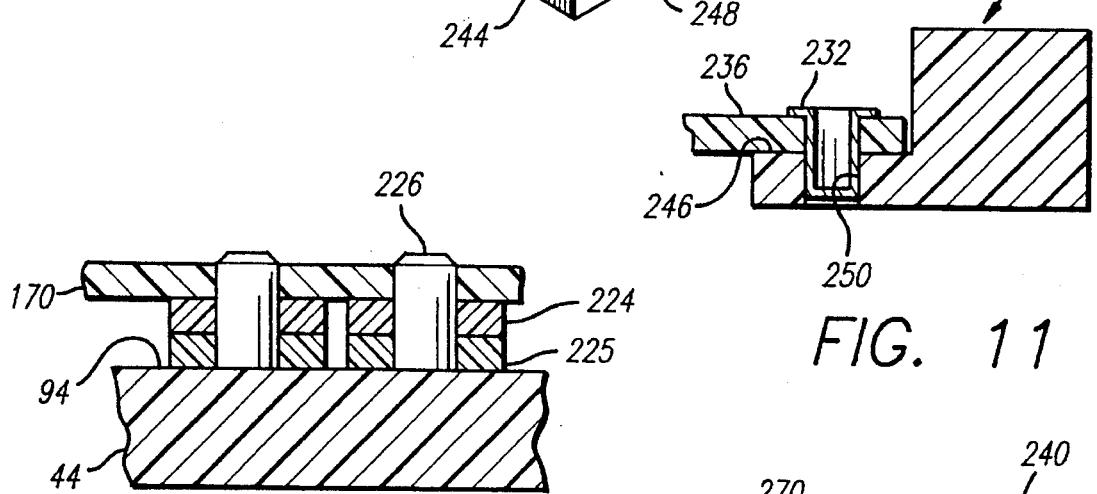
FIG. 11
FIG. 8A
FIG. 12

5,563,771

IC CARD WITH BOARD POSITIONING MEANS

CROSS REFERENCE

This is a continuation of U.S. application Ser. No. 08/528,341 filed Sep. 14, 1995, which is a Continuation-In-Part of U.S. application Ser. No. 08/201,983 filed Feb. 25, 1994, now U.S. Pat. No. 5,477,426 issued Dec. 19, 1995, which is a Continuation-In-Part of U.S. application Ser. No. 08/168,101 filed Dec. 15, 1993.

BACKGROUND OF THE INVENTION

IC cards, which are often memory cards, are commonly constructed with a molded plastic frame. Front and rear connectors are mounted and/or molded into the frame, and top and bottom covers are mounted on the frame. U.S. Pat. Nos. 5,207,586 and 5,244,397 show IC cards of this construction. If the number of parts to be constructed and assembled were reduced, the IC cards could be constructed at lower cost.

Under JEIDA standards, each IC card has a card length of 3.370 inch, a card width of 2.126 inch, and a card thickness of 0.190 inch. Accordingly, there is very little vertical space between top and bottom surfaces of the circuit boards and the top or bottom cover portions of the card. If the vertical height of the circuit board could be changed, a designer could leave about equal spaces at both surfaces of the circuit board to place a maximum number of thin components on both board surfaces. Alternatively, the designer could maximize the space on one board surface to accommodate thicker components on that surface, at the expense of eliminating moderately thick components on the other surface. If such choice could be made by the circuit board manufacturer who assembles the IC card, with the other components unchanged from a "standard" design, this would increase design choices for the circuit board manufacturer.

SUMMARY OF THE INVENTION

In accordance with one embodiment of the present invention, an IC card is provided that is of low cost and which allows adjustment of circuit board height. The IC card includes a circuit board with its forward and rearward end portions respectively mounted on forward and rearward connectors, without requiring an intermediate frame. The cover is also mounted on the front and rear connectors and is connected to the circuit board substantially only by an electrical ground connection.

Each connector has a laterally-extending row of contacts that engage corresponding contact pads on an end portion of the circuit board. Pegs lying laterally beyond opposite ends of the row of contacts connect the circuit board to the connector. Each circuit board end portion has holes at its opposite sides which receive corresponding pegs. The pegs can be integrally molded in a connector housing, or the pegs can be separate parts mounted in holes in the connector housing.

Each peg can have at least two steps. Board-supporting surface regions of different heights lie at the bottoms of the steps, to support a circuit board at a selected height, while the pegs horizontally locate the board. An alternative is to provide a washer of selected thickness between the circuit board and a connector, at each peg.

The novel features of the invention are set forth with particularity in the appended claims. The invention will be best understood from the following description when read in conjunction with the accompanying drawings.

BRIEF DESCRIPTION OF THE DRAWINGS

FIG. 1 is an isometric view of an IC card of the present invention, and showing, in phantom lines, a portion of an electronic device that receives the card.

FIG. 3 is a partial exploded view of a connector and of a circuit board end portion that can mount thereon.

FIG. 4 is a partial sectional view taken on line 4—4 of FIG. 3, showing the parts in an assembled position.

FIG. 6 is a partial sectional view of the IC card of FIG. 1.

FIG. 7 is a partial sectional view of the IC card of FIG. 1.

FIG. 8 is a partial isometric view of a peg constructed in accordance with another embodiment of the invention.

FIG. 8A is a partial sectional view of a connector and circuit board of another embodiment of the invention, with spacer washers.

FIG. 9 is a partial exploded view of a peg and circuit board constructed in accordance with another embodiment of the invention.

FIG. 10 is a partial exploded isometric view of an IC card constructed in accordance with another embodiment of the invention.

FIG. 11 is a partial sectional view of the IC card of FIG. 10.

FIG. 12 is a partial sectional view of the IC card of FIG. 11, but with a spacer washer and a plastic peg.

DESCRIPTION OF THE PREFERRED EMBODIMENTS

Figure 2:
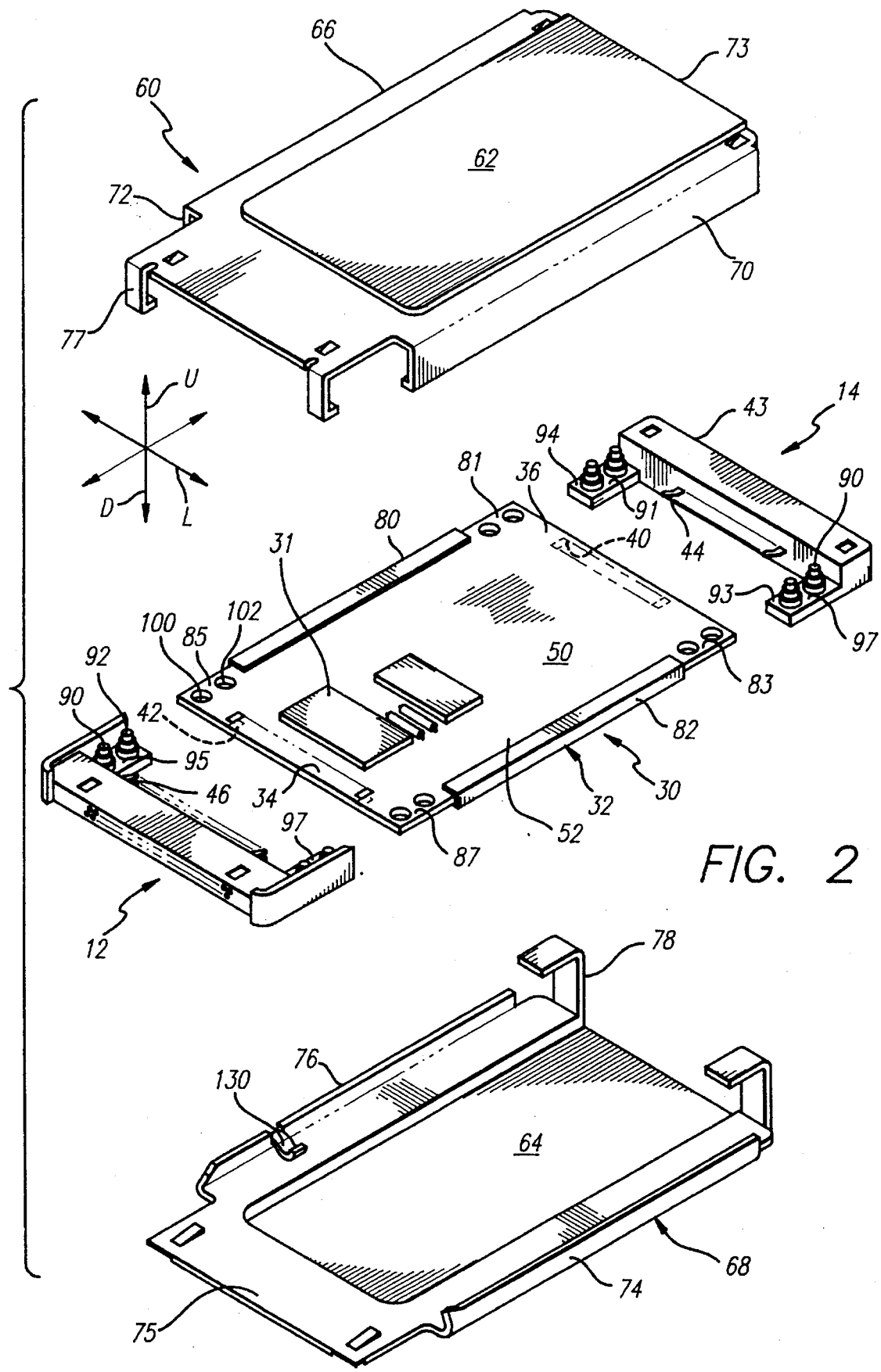
FIG. 2 is an exploded isometric view of the IC card of FIG. 1.

FIG. 1 illustrates an IC card 10 which has connectors 12, 14 at its opposite ends. The connectors 12, 14 can be designated respectively as front and rear connectors, although the opposite could be done. The card is designed to be inserted in a forward direction F into an electronic device 16, until contacts 20 on the front connector engage corresponding contacts 22 of the electronic device. The card is withdrawn in a rearward direction R. IC cards have standard maximum dimensions under PCMCIA standards, in upward and downward directions U, D, lateral directions L and longitudinal directions F, R. The IC card should be constructed at low cost while providing maximum utilization of the limited space within the card to hold electronic components.

FIG. 2 shows that the IC card includes a circuit board assembly 30 with electronic components 31 such as integrated circuits, resistors, capacitors, etc., which are mounted on a circuit board 32. The circuit board has laterally opposite side 80, 82 and forward and rearward end portions 34, 36, and has laterally-extending rows of contact pads 40, 42 at its opposite end portions. The front and rear connectors 12, 14 each include a block 43 of molded plastic forming a connector housing, and at least one laterally extending row of contacts with contact tails 44, 46. The contact tails are constructed to engage corresponding rows of contact pads 40, 42 on the circuit board. It is noted that the circuit board has upper and lower surfaces 50, 52, and the contact pads are normally located on the lower surface 52.

A cover 60 is designed to surround the circuit board assembly. The cover includes upper and lower cover parts 66, 68 that have sheet-like portions 62, 64 that lie respectively above and below a majority of the surface area of the circuit board. The upper cover part includes a pair of upper side flanges 70, 72, which engage corresponding lower side flanges 74, 76 on the lower cover part. The parts are assembled by first mounting the circuit board opposite end portions on the connector 12, 14. This subassembly is placed in the lower cover part 68. The rear 73 of the upper cover part is placed at the front 75 of the lower one, and the upper cover part is slid in the rearward direction R. U-shaped fingers 77, 78 at the front and rear of corresponding cover parts help to keep the fully assembled cover parts in place on the connectors.

Previous PCMCIA IC cards have used a molded plastic frame which held the other parts together. U.S. Pat. Nos. 5,207,586 and 5,244,397 show IC cards of this type, wherein the molded plastic frame extended between the front and rear connectors and held them rigidly in place, supported the circuit board assembly, and supported top and bottom cover parts. Although in previous and present IC cards there is some mechanical connection between the circuit board and the connectors through the soldering connection of the rows of contact tails or contacts 44, 46 with the conductive pads 40, 42 on the circuit board, such solder connections usually cannot be relied upon for strong mechanical coupling, which was previously achieved by the molded plastic frame.

In accordance with one aspect of the present invention, applicant provides a frameless IC card wherein the opposite end portions 34, 36 of the circuit board, mount directly on the front and rear connectors 12, 14. The rear end portion 36 of the board has board mount parts 81, 83 at its opposite sides, that mount on the rear connector 14, and the front end portion 34 of the board has board mount parts 85, 87 that mount on the front connector 12. The connectors have corresponding support parts 91, 93, 95 and 97, with all mount parts being similar and all support parts being similar. As shown in FIG. 3, each circuit board mount part such as 81, extends laterally beyond a corresponding row of contact pads 42 (e.g. laterally beyond an end of the row). Each board mount part such as 81 of the circuit board end portion is directly mounted on a corresponding connector support part such as 91 which extends laterally beyond a corresponding row of contacts 46. Each support part such as 91, includes first and second platforms or pegs 90, 92 that extend up from a first board-supporting surface 94. The side 80 of the circuit board which forms the mount part 81, has a pair of holes 100, 102 that are designed to closely receive the corresponding pegs 90, 92. Thus, the front and rear connectors form an apparatus for holding the circuit board. Each of the pegs has several steps, which will be discussed below.

With the front and rear portions of the circuit board securely mounted on the front and rear connectors, the cover can be placed around the circuit board and connectors. FIG. 6 shows the manner in which the upper and lower cover parts 66, 68 are mounted on the front and rear connectors 12, 14. The upper cover part 66 has downwardly-inclined tabs 1100 112 which project into corresponding recesses 114 at the tops of the connectors. The lower cover part has tabs 115, 116 that project into corresponding recesses 117 at the bottoms of the connectors. The tabs form connect parts that mount the cover ends to the connectors, to thereby attach the cover parts to the connectors. Cover parts such as 118 lying against the connectors also form connect parts. Adhesive also can be used to hold the cover parts to the connectors. The cover parts also have interfitting side flange parts (FIG. 7). It is noted that the covers are directly mounted on the front and rear connectors, as is the circuit board 30. No intermediate frame apart from the cover parts and circuit board, extends between the connectors. It is noted that there is a grounding electrical connection between the cover and a ground plane of the circuit board. FIG. 7 shows that the lower cover part 68 has a tab 130 which engages a location on a ground plane 132. However, this does not provide a rigid connection or mechanical support, and there is substantially no other direct connection between the circuit board and cover.

FIGS. 3 and 4 show that each platform or peg 90, 92 has a plurality of peg parts or steps 140, 142, and 144. The first step 140 is of greatest width A, while the second and third steps 142, 144 have progressively smaller widths B and C. The support part 91 forms board-supporting surfaces or surface regions 94, 150, 152 at the bottom of each step. The holes such as 100 in the circuit board 30, are shown in FIG. 4 as having a hole width B so the walls of the circuit board holes are closely received in the second steps 42, and the lower surface of the circuit board rests on the second board-supporting surface region 150.

The connectors 12, 14 (FIG. 2) and cover 60 are usually made by a manufacturer who makes large volumes of such connectors and covers, The connector and cover manufacturer commonly sells such parts to a firm that designs and constructs a circuit board with its own circuitry thereon, and assembles the circuit board to the connectors and cover to form a complete IC card. The circuit board manufacturer usually has drills that can form the holes such as 100, 102 so the holes are of a closely controlled width or diameter, and in a pattern wherein the holes are precisely located. The circuit board manufacturer can choose the particular height of the circuit board by choosing the diameter of the circuit board holes that he drills. A particular height of the circuit board above the first surface 94, is chosen so that the desired circuit components can be mounted on the circuit board. If an engineer who designs the circuit board requires components of large vertical thickness, he may drill small holes so that the circuit board rests on the third platform 152 (FIG. 4). This will leave a relatively thick space below the bottom of the circuit board, on which the thick component can be mounted. However, it will leave little room for mounting components on the upper surface of the circuit board. On the other hand, if the engineer wishes to cram a large number of circuit components of moderately small thickness onto the board, he can use large diameter holes so the circuit board rests on the first surface region 90. This will leave thick spaces both above and below the circuit board, between the board and the covers 66, 68.

Figure 5:
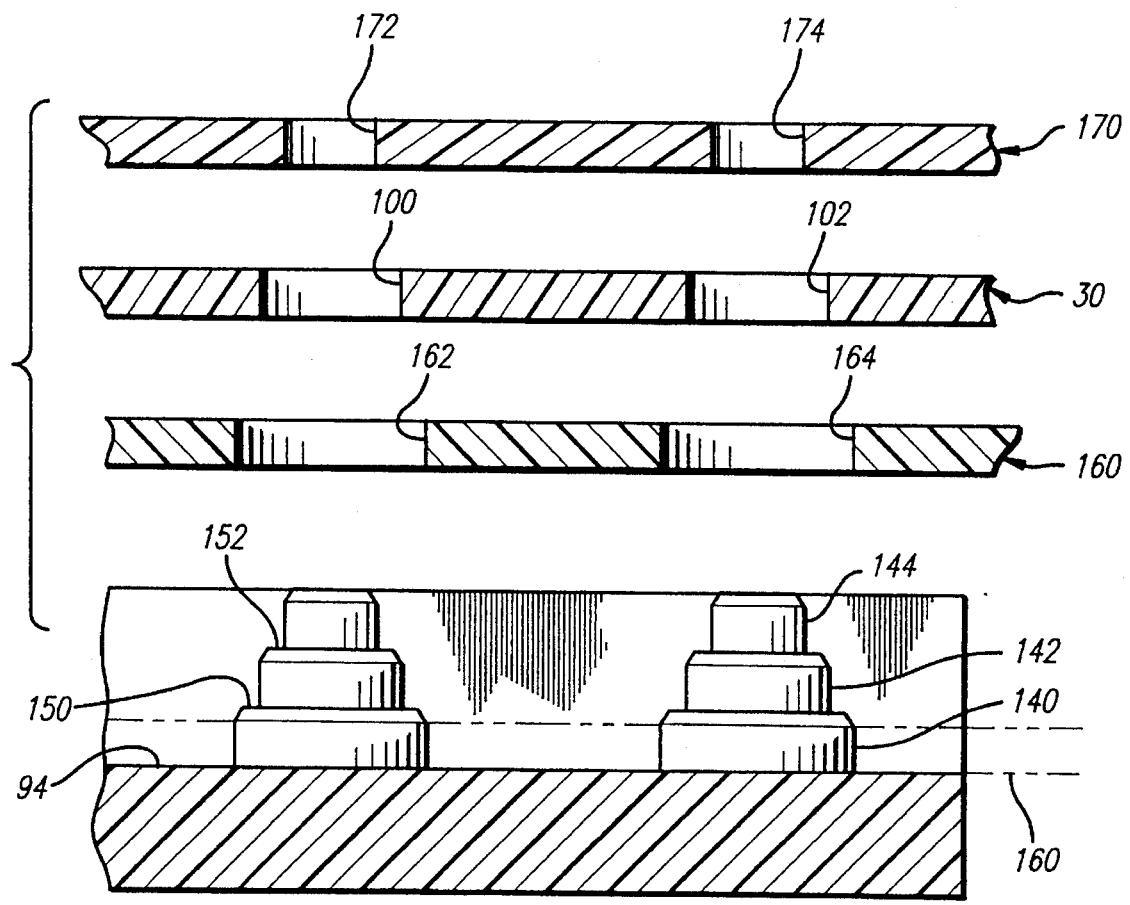
FIG. 5 is a partial sectional view of the connector and circuit board of FIG. 4, and also showing two other circuit boards which can be used.

FIG. 5 shows another circuit board 160, that is similar to the circuit board 30, but wherein the circuit board 160 has holes 162, 164 to enable it to be received by the lowermost step or peg part 140. The figure also shows still another circuit board 170 with smaller holes 172, 174 that enable it to be closely received by the third pegs or steps 144.

A variety of approaches can be used to securely fasten the circuit board in place after its holes have received the pegs. One method is to use simple press fitting. Another method is to use adhesive which will adhere the lower surface and the walls of its holes to the peg and/or the lowermost surface 94. FIG. 8 shows modified pegs 90A with slots 150 that permit the pegs to be compressed when a circuit board is pressed firmly in place. In FIG. 8, the peg 90A is manufactured separately from the connector 12A, with the peg having a post 152 press fitted into a hole in the connector.

FIG. 9 illustrates part of an assembly 180 of another embodiment of the invention, wherein each peg or platform is of rectangular shape as seen in a plan view taken along vertical line 194. A particular peg or platform 192 has three steps 200, 202, 204 and three corresponding board-supporting surfaces 206, 208, and 210. The circuit board 211 has a hole 212 designed to receive one of the steps, with the particular hole 212 shown in solid lines being designed to receive the uppermost step 204, so the lower surface 214 of the circuit board lies on the board-supporting surface 210. FIG. 9 shows two other hole sizes 216, 218 of different widths to enable the circuit board to lie at progressively lower heights. The holes such as 212 are in the form of slots that extend to the extreme side edge 220 of the circuit board and can be larger than those illustrated. While such slots are not as easy to form as round holes, they can be formed by saws that cut into the edge of the circuit board. FIG. 9 also shows that the circuit board 211 has a ridge or integral beam portion 222 that increases the longitudinal rigidity of the circuit board.

Instead of using stepped pegs, long pegs can be used which are of uniform diameter, with washers to select the spacing of the circuit board from a connector surface. FIG. 8A shows an example of this, where washers 224, 225 space the circuit board 170 from a connector 44. The washers surround long pegs 226. The circuit board lies substantially against the connector board-supporting surface 94, since the washers act as thicker parts of the circuit board that take only compressive force rather than any bending forces.

FIGS. 10–12 illustrate an assembly 230 of another embodiment of the invention, wherein pegs 232, 234 project through holes in a circuit board 236 and into holes in a connector block housing 240 of a connector 241. The particular pegs shown are formed from sheet metal. The connector housing has board support parts 242, 244 forming board-supporting surfaces 246, 248 with peg-receiving holes 250, 252 therein. The circuit board has holes 254, 256 that are aligned with the connector holes. The holes lie on laterally opposite sides of a row of contacts (such as 46 in FIG. 3).

The assembly 230 can be constructed by drilling the board holes 254, 256 so they can be aligned with the connector holes 250, 252, and placing the circuit board over the connector support parts with the holes in alignment. Then the pegs are inserted and pushed down through the board and connector holes. Alternatively, the pegs can be first installed in the circuit board holes, and then pushed down with the circuit board, against the connector board-supporting surfaces. The pegs are retained in the connector holes by an interference fit therein, and/or by barbs formed in the pegs, adhesive, staking, etc. It is possible to project slightly longer pegs upwardly through the connector holes and through the circuit board holes, and with the upper ends of the pegs staked, as by rolling over the upper ends of sheet metal pegs or heat-deforming the upper ends of plastic pegs.

FIG. 12 shows an arrangement 260 similar to that of FIGS. 11–12 except that a spacer washer 262 is used to raise the level of the faces 264, 266 of the circuit board 236. Also, a longer peg 270 is used, with a plastic peg being shown which lies in interference fit with the connector hole 250. The washer preferably has a hole for receiving the peg, with parts of the washer lying on opposite sides of the peg. The washer is held tightly between the circuit board 236 and board support part 242, by being slightly compressed between them. The circuit board 236 is mounted substantially against the connector board-supporting surface 246, in that the washer 262 acts like a thickened part of the circuit board. It is possible to provide separate pegs with steps in them (e.g. as shown at 90 in FIG. 3).

The use of pegs to position the circuit board on the connectors, has the advantage that the pegs can accurately locate the contact tails 46 (FIG. 3) against the circuit board traces 42 to which the tails are soldered. A common IC card design has sixty-eight contacts at the front connector, with a lateral spacing of contact tails of about 0.63 mm (0.025 inch). The contact tails must be positioned within 0.25 mm (0.010 inch) of the ideal position, and preferably within about 0.1 mm (0.005 inch). Such positioning can be readily accomplished by having the pegs fit within the circuit board holes with a clearance of no more than 0.1 mm (0.005 inch).

Although terms such as "vertical", "horizontal", "upper and lower", etc, have been used herein to describe the parts of the IC card as shown in the figures, it should be understood that the IC card and its parts can be assembled and used in any orientation with respect to gravity.

In the arrangements illustrated, each end portion of the circuit board is rigidly connected to a corresponding connector at locations laterally beyond the row of connector contacts. It is possible for the circuit board to extend rearwardly and forwardly slightly further and to mount to connector locations that lie above the row of contacts. However, such mounting is more difficult because it requires the portions of the connector that hold the front contact portions to be thinner. In the case of the front connector which typically has two vertically spaced rows of contacts (but with the tails usually lying in one row), there is very little room for such mounting. By mounting the circuit board on laterally opposite sides of each connector, applicant uses connector portions that may not be otherwise utilized and which can be easily made to be thinner than the contact-holding portions. In some cards, no contacts are required at the rear of the card, in which case the rear connector can be formed by a block of molded plastic without contacts.

Thus, the invention provides an IC card which is of simplified construction and which simplifies selection of circuit board height with respect to the connectors. The IC card is frameless, in that opposite end portions of the circuit board are directly and rigidly (except for any washer resilience) connected to front and rear connectors. The cover can include upper and lower cover parts that are also directly mounted on the connector, or a one-piece cover can be used. All of this is preferably accomplished without the use of a separate frame that would extend between the front and rear connectors and which would support the circuit board and cover parts. The connection of each circuit board end portion to a connector is preferably accomplished at locations laterally beyond the row or rows of contacts of the connector, so that attachment occurs in connector regions of moderately small vertical thickness. Such connections can be accomplished by providing pegs on the connectors, which are received in holes formed in the circuit board. The pegs can be mounted on the connectors by molding the pegs integrally with the connector housing, or by providing holes in the connector housing that receive separate pegs. Washers can be placed between a board-supporting surface of a connector housing and a circuit board location. An alternative is the use of pegs with steps.

Although particular embodiments of the invention have been described and illustrated herein, it is recognized that modifications and variations may readily occur to those skilled in the art, and consequently, it is intended that the claims be interpreted to cover such modifications and equivalents.

I claim:

1. An IC card apparatus for holding a circuit board assembly that includes a circuit board and components on the circuit board, wherein the circuit board has front and rear end portions, has a row of conductive pads at each of said end portions, and has a plurality of holes at each of said end portions, comprising:

front and rear connectors that each has a row of contacts for engaging a corresponding one of said rows of conductive pads;

each of said connectors having a plurality of support parts that are spaced from said contacts and that are arranged in a predetermined pattern, with each support part including a board-supporting surface and a peg extending above said surface to project into a corresponding circuit board hole;

said circuit board has front and rear end portions mounted respectively on said front and rear connectors; and including a cover that has upper and lower sheet metal cover parts that form upper and lower portions lying respectively above and below said circuit board, said cover parts having sides that are joined to lie on opposite sides of said circuit board, with said cover parts each having front and rear ends rigidly mounted on said front and rear connectors, and with said cover parts substantially free of rigid connection to said circuit board.

2. The combination of a circuit board assembly and an IC card apparatus for holding said circuit board assembly, wherein said circuit board assembly includes a circuit board and components on the circuit board, and wherein said circuit board has front and rear end portions and has a row of conductive pads at each of said end portions and has a plurality of holes at each of said end portions, comprising:

front and rear connectors that each has a row of contacts engaging a corresponding one of said rows of conductive pads;

each of said connectors having a plurality of support parts that are spaced from said contacts and that are arranged in a predetermined pattern, with each support part including a board-supporting surface and a peg extending above said surface to project into a corresponding circuit board hole, with said circuit board front and rear end portions mounted respectively on said front and rear connectors, and with each circuit board end portion having a plurality of holes that each receives one of said pegs and having a lower board surface portion lying on said board-supporting surface;

each of said pegs has first and second steps with said second step projecting up from said first step, with each second step being narrower than the corresponding first step and with the corresponding connector support part having a board-supporting surface region, including said board-supporting surface, lying at the bottom of each step.

3. The IC card apparatus described in claim 2 wherein:

each of said plurality of holes of said circuit board receives one of said second steps and has a lower board surface portion lying on a corresponding one of said board-supporting surface regions.

4. A method for constructing an IC card, which includes forming front and rear connectors each with a laterally extending row of contacts, forming a circuit board which has a peripheral edge, with a laterally extending row of contact pads on its forward and rearward end portions, forming a cover, and assembling said connectors, circuit board, and cover into an IC card, characterized by:

said step of forming said connectors includes forming each of said connectors with at least one upstanding peg on laterally opposite sides of said row of contacts;

said step of forming said circuit board includes forming round holes in said front and rear end portions where said round holes are spaced from said circuit board edge and lie laterally beyond said rows of contact pads, and including placing said circuit board end portions against said connectors with said pegs received in said holes;

mounting said cover substantially only on said front and rear connectors.

5. A frameless IC card comprising:

front and rear connectors that each have a laterally extending width dimension;

a circuit board assembly that includes a circuit board and at least one circuit component mounted on said board, said circuit board having front and rear end portions;

a sheet metal cover having upper and lower sheet-like portions lying respectively above and below said circuit board assembly, said cover including front and rear end portions;

said cover front and rear end portions being mounted respectively on said front and rear connectors, and said circuit board front and rear end portions being mounted respectively on said front and rear connectors, with said cover and circuit board being mounted directly on said connectors, and with said IC card being devoid of any intermediate frame spanning the distance between said connectors to connect said circuit board or cover to said connectors;

said front connector has a laterally extending row of contacts and has pegs spaced from said row of contacts, and said circuit board has a laterally extending row of contact pads engaged with said contacts and has holes that each receives one of said pegs.

* * * * *